United States Patent
Kim et al.

(10) Patent No.: US 10,644,058 B2
(45) Date of Patent: May 5, 2020

(54) IMAGE SENSOR INCLUDING SPLITTER

(71) Applicant: Samsung Electronics Co., Ltd., Suwon-si (KR)

(72) Inventors: Jung-Hun Kim, Suwon-si (KR); Sang-Su Park, Seoul (KR); Chang-Hwa Kim, Hwaseong-si (KR); Hyung-Yong Kim, Cheongju-si (KR); Beom-Suk Lee, Yongin-si (KR); Man-Geun Cho, Suwon-si (KR); Jae-Sung Hur, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/171,841

(22) Filed: Oct. 26, 2018

(65) Prior Publication Data

US 2019/0157336 A1 May 23, 2019

(30) Foreign Application Priority Data

Nov. 17, 2017 (KR) .......................... 10-2017-0154312

(51) Int. Cl.
  *H01L 27/146* (2006.01)
  *G02B 27/10* (2006.01)
  *H01L 25/16* (2006.01)
  *G02B 27/09* (2006.01)

(52) U.S. Cl.
  CPC ...... *H01L 27/14643* (2013.01); *G02B 27/095* (2013.01); *G02B 27/1006* (2013.01); *H01L 25/167* (2013.01); *H01L 27/14603* (2013.01); *H01L 27/14621* (2013.01); *H01L 27/14625* (2013.01); *H01L 27/14645* (2013.01); *H01L 27/14665* (2013.01)

(58) Field of Classification Search
  CPC .................................................. H01L 31/1016
  See application file for complete search history.

(56) References Cited

U.S. PATENT DOCUMENTS

| 7,595,216 | B2 | 9/2009 | Shim |
| 9,673,055 | B2 | 6/2017 | Anderson et al. |
| 2016/0064448 | A1* | 3/2016 | Shin ................. H01L 27/14645 257/292 |
| 2016/0111458 | A1 | 4/2016 | JangJian et al. |
| 2017/0097510 | A1 | 4/2017 | Sohn |
| 2017/0133429 | A1 | 5/2017 | Cheng et al. |
| 2018/0182794 | A1 | 6/2018 | Go et al. |

FOREIGN PATENT DOCUMENTS

| KR | 1133495 B1 | 4/2012 |
| KR | 20180076845 A | 7/2018 |

* cited by examiner

*Primary Examiner* — Cheung Lee
(74) *Attorney, Agent, or Firm* — Muir Patent Law, PLLC

(57) ABSTRACT

An image sensor includes a plurality of photo diodes disposed at a semiconductor substrate, and a splitter disposed on the photo diodes. The splitter splits an incident light depending on a wavelength so that split light of different colors enters different photo diodes, respectively. The splitter includes a first pattern structure having a cross-sectional structure in which a plurality of refractive layer patterns are deposited in a lateral direction.

18 Claims, 17 Drawing Sheets

IMAGE SENSOR INCLUDING SPLITTER

CROSS-REFERENCE TO RELATED APPLICATION

This application claims priority under 35 USC § 119 to Korean Patent Application No. 10-2017-0154312, filed on Nov. 17, 2017 in the Korean Intellectual Property Office (KIPO), the contents of which are herein incorporated by reference in their entirety.

BACKGROUND

1. Field

Example embodiments relate to image sensors. More particularly, example embodiments relate to image sensors including a splitter.

2. Description of the Related Art

Recently, image sensors having a small pixel size and superior characteristics have been developed. It is desirable for these image sensors to have a high sensitivity by reducing an amount of an absorbed light that does not reach a photo diode.

SUMMARY

Example embodiments provide an image sensor having a high sensitivity.

According to example embodiments, there is provided an image sensor. The image sensor includes a plurality of photo diodes disposed at a semiconductor substrate, and a splitter disposed on the photo diodes. The splitter splits an incident light depending on a wavelength so that split light of different colors enters different photo diodes, respectively. The splitter includes a first pattern structure having a cross-sectional structure in which a plurality of refractive layer patterns are disposed adjacent to each other in a lateral direction.

According to example embodiments, there is provided an image sensor. The image sensor includes a plurality of photo diodes respectively disposed in unit pixel regions of a semiconductor substrate, and a splitter disposed on a first surface of the semiconductor substrate and spaced apart from the photo diodes. The splitter splits an incident light depending on a wavelength so that split light of different colors enters different photo diodes, respectively. The splitter includes a first pattern structure in which a boundary extending in a vertical direction is formed between two of a plurality of refractive layer patterns.

According to example embodiments, there is provided an image sensor. The image sensor includes a plurality of photo diodes respectively disposed in the unit pixel regions of the semiconductor substrate, and a splitter disposed on a first surface of the semiconductor substrate and spaced apart from the photo diodes. The splitter splits an incident light depending on a wavelength so that split light of different colors enters different photo diodes, respectively. The splitter consists of a first refractive pattern structure having a cross-sectional structure in which a plurality of refractive layer patterns are stacked in a lateral direction with respect to each other.

According to example embodiments, an image sensor includes a splitter. Thus, an amount of a light entering a photo diode may be increased so that the image sensor may have a high sensitivity.

DETAILED DESCRIPTION

Hereinafter, example embodiments will be described more fully with reference to accompanying drawings.

Figure 1:
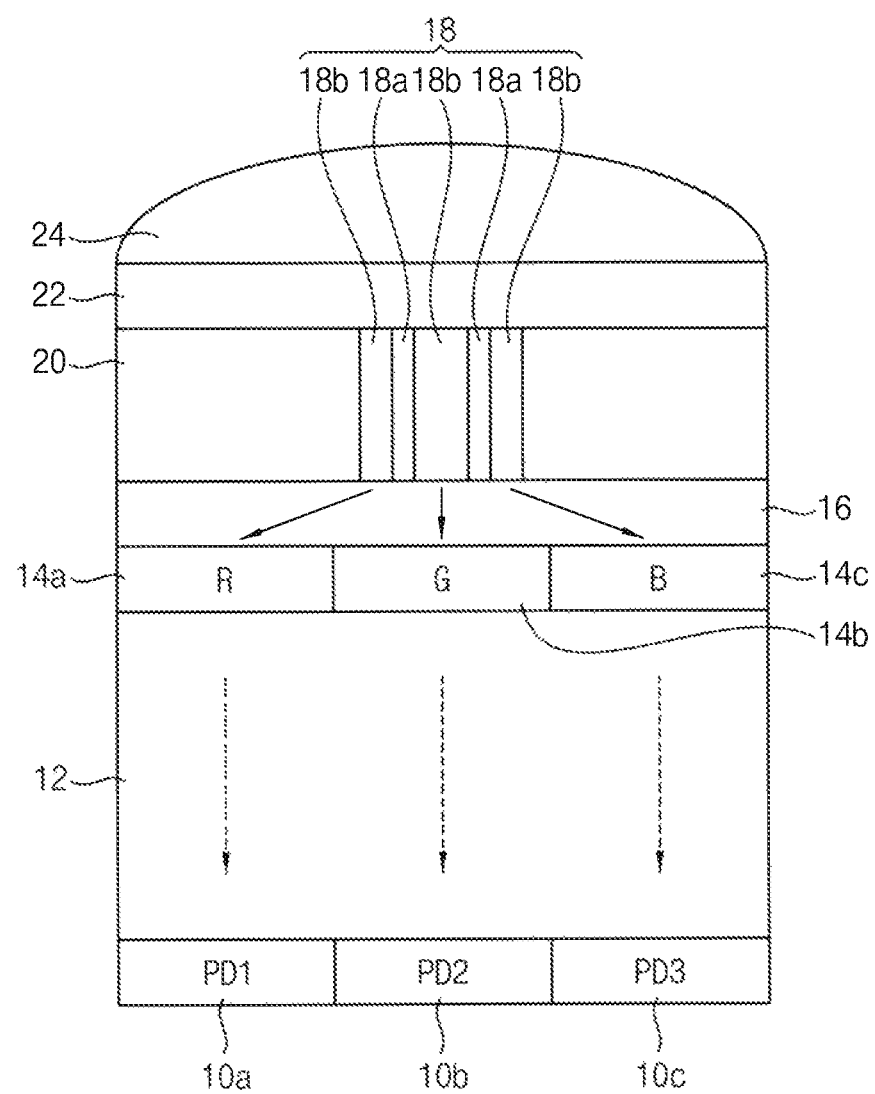
FIG. 1 is a schematic cross-sectional view illustrating an image sensor according to example embodiments.
Figure 2:
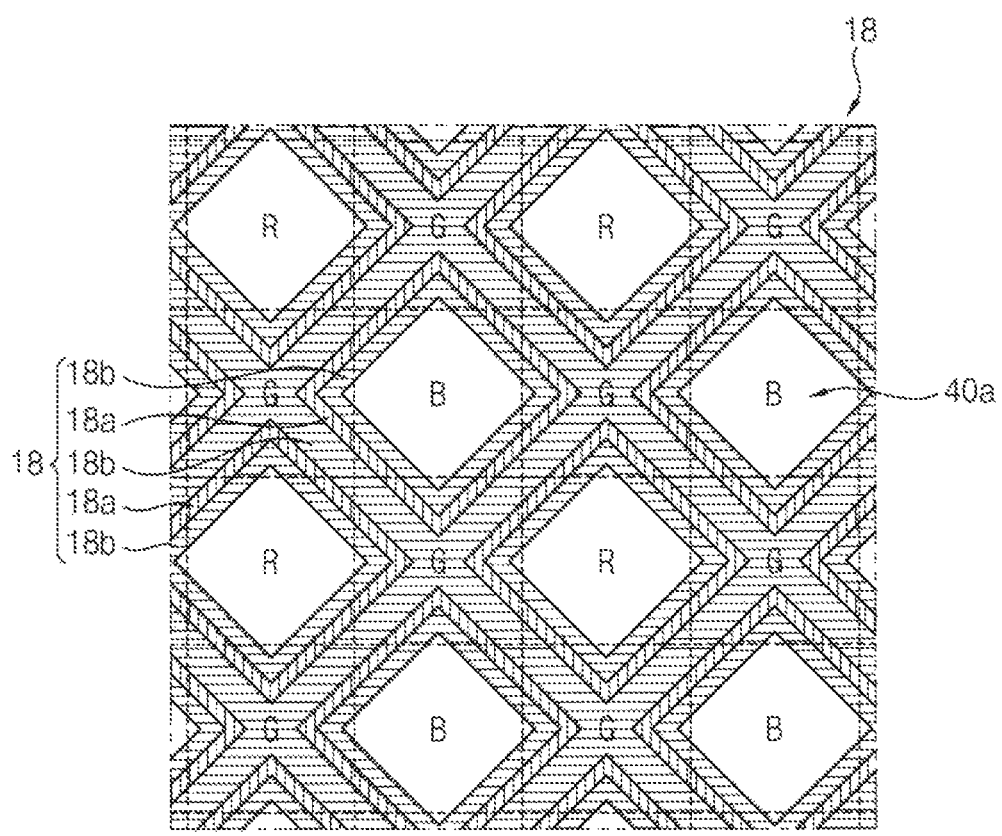
FIG. 2 is a plan view illustrating disposition of splitters according to example embodiments.

FIG. 1 is a schematic cross-sectional view illustrating an image sensor according to example embodiments. FIG. 2 is a plan view illustrating disposition of splitters according to example embodiments.

Referring to FIG. 1, an image sensor may include a plurality of unit pixels arranged in a matrix configuration. Each of the unit pixels may include photo diodes 10a, 10b and 10c and color filters 14a, 14b and 14c. A splitter 18 may be disposed on the color filters 14a, 14b and 14c.

The photo diodes 10a, 10b and 10c may be disposed in a semiconductor substrate. The semiconductor substrate may be one selected from a bulk substrate, an epitaxial substrate or an SOI (silicon on insulator) substrate. For example, the semiconductor substrate may include silicon (Si). Furthermore, the semiconductor substrate may include a semiconductor element such as germanium (Ge), or a compound semiconductor such as silicon carbide (SiC), gallium arsenide (GaAs), indium arsenide (InAs) or indium phosphide (InP). The photo diodes 10a, 10b and 10c may include an impurity region doped with impurities.

A first interlayer insulation layer 12 may be disposed to cover the photo diodes 10a, 10b and 10c on the semiconductor substrate. The first interlayer insulation layer 12 may include, for example, an electrically insulating material such as silicon oxide.

The color filters 14a, 14b and 14c may be disposed on the first interlayer insulation layer 12. The color filters 14a, 14b and 14c may selectively transmit a color light having a specific wavelength.

The color filters may include a red color filter 14a, a green color filter 14b and a blue color filter 14c. Other color filters may be used, and in general, the color filters may be referred to a first color filter, second color filter, and third color filter, etc., where each color filter filters a different color. The color filters 14a, 14b and 14c may be disposed to face and to be spaced apart from the photo diodes 10a, 10b and 10c, respectively. For example, the red color filter 14a may be vertically aligned with and may face the first photo diode 10a, the green color filter 14b may be vertically aligned with and may face the second photo diode 10b, and the blue color filter 14c may be vertically aligned with and may face the third photo diode 10c.

A planarizing layer 16 may be disposed on the color filters 14a, 14b and 14c. The planarizing layer 16 may include, for example, silicon oxide. For example, the planarizing layer 16 may include an SOG (silicon on glass) layer.

The splitter splits an incident light from an exterior depending on a wavelength of the light, before the light reaches the color filters 14a, 14b and 14c, so that the split light of different colors may enter the different color filters 14a, 14b and 14c. Thus, the splitter 18 may be disposed on the color filters 14a, 14b and 14c and may be spaced apart from the color filters 14a, 14b and 14c. Through the splitter 18, a red light may enter the red color filter 14a, a green light may enter the green color filter 14b, and a blue light may enter the blue color filter 14c. The split light having different colors may be referred to generally as a first-colored light, second-colored light, and third-colored light that exit the splitter 18 after being split. As can be seen in the example of FIG. 1, the splitter consists of a first refractive pattern structure (e.g., 18) having a cross-sectional structure in which a plurality of refractive layer patterns (e.g., 18b, 18a, 18b, 18a, and 18b) are stacked in a lateral direction with respect to each other.

A filling layer pattern 20 may be disposed at both sides of the splitter 18. The filling layer pattern 20 may include, for example, silicon oxide. An upper surface of the splitter 18 and an upper surface of the filling layer pattern 20 may be disposed on the same plane to be continuously connected to each other. It should be noted that terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

A cross-section of a pattern structure provided as the splitter 18 may have a shape in which a plurality of refractive layer patterns 18a and 18b are repeatedly deposited (and for example, are stacked) in a lateral direction. For example, some or all of these patterns 18a and 18b may have a vertical height (e.g., vertical with respect to a surface of a substrate) greater than a horizontal width (e.g., horizontal with respect to the surface of the substrate). Thus, the refractive layer patterns 18a and 18b may be divided by a boundary extending in a vertical direction. In an example embodiment, the pattern structure 18 may have a height of 4,000 Å to 8,000 Å in a vertical direction to a surface of a substrate. In an example embodiment, the pattern structure 18 may have a width of 2,000 Å to 4,000 Å in a direction horizontal to the surface of the substrate. Thus, in some embodiments, the height of the pattern structure 18 may be the about the same as the width of the pattern structure 18. In other embodiments, the height of the pattern structure 18 may be between about 1 time to about 4 times the width of the pattern structure 18. In more specific examples, the height of the pattern structure 18 may be between about 2 times to about 3 times the width of the pattern structure 18. Thus in these different examples, the width in a horizontal direction of the combined plurality of refractive layer patterns that form the pattern structure 18 is less than the height in a vertical direction of the combined plurality of refractive layer patterns. As mentioned further below, the features of the pattern structure 18 in the various figures are not necessarily drawn to scale. The width and the number of the refractive layer patterns 18a and 18b may be adjusted so that the pattern structure 18 may have a predetermined width. In the pattern structure 18, the refractive layer patterns may be symmetrically disposed with respect to the central-disposed refractive layer pattern 18b. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As shown in the figures, in some embodiments, the first, central-disposed refractive layer pattern 18b may have a greater width than each of the second, opposing laterally-disposed refractive layer patterns 18a, and may have a greater width than each of the third, opposing outer laterally-disposed refractive layer patterns 18b. In some embodiments, each third, outer laterally-disposed refractive layer pattern 18b has a greater width than each second, laterally-disposed refractive layer pattern 18a, but in other embodiments, these widths may be the same. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The refractive layer patterns 18a and 18b may include a transparent material having a refractive index in a range, for example, of 2.0 to 3.0. Examples of the transparent material may include a metal oxide such as titanium oxide, niobium oxide or the like.

Since the refractive layer patterns 18a and 18b are deposited in a lateral direction, a grain boundary extending in a vertical direction may be formed at an interface between the refractive layer patterns 18a and 18b.

In an example embodiment, the refractive layer patterns 18a and 18b adjacent to each other may include the same transparent material. In some embodiments, the refractive layer patterns 18a and 18b adjacent to each other may include different transparent materials. For example, two refractive layer patterns 18a and 18b, which are different from each other (and formed of either the same or different materials), may be alternately deposited in a lateral direction. Thus, the refractive layer patterns 18a and 18b may be divided by a boundary extending in a vertical direction. The boundary may include a grain boundary extending in a vertical direction.

In an example embodiment, the refractive layer patterns 18a and 18b adjacent to each other may have different widths. For example, some of the refractive layer patterns 18a and 18b may have the same width (e.g., each third, outer laterally-disposed refractive layer pattern 18b may have the same width, and each second, laterally-disposed refractive layer pattern 18a may have the same width, and in some cases all laterally-disposed refractive layer patterns have the same widths as each other) and some of the refractive layer patterns 18a and 18b may have a different width from others (e.g., central refractive layer pattern 18b may be wider than any other refractive layer patterns). In other embodiments, each refractive layer pattern 18a and 18b adjacent to each other may have the same width.

As illustrated in FIG. 2, the splitter 18 may face at least a portion of each color filter 14a, 14b and 14c along a vertical direction. In a plan view, the splitter 18 may have a grid shape. In an example embodiment, the splitter 18 may have a shape extending to cross the green color filter 14b.

A capping layer 22 may be disposed on the splitter 18 and the filling layer pattern 20. The capping layer 22 may include, for example, silicon oxide.

A micro-lens 24 may be disposed on the capping layer 22. The micro-lens 24 may have a curved upper surface. In an example embodiment, the micro-lens 24 may be omitted.

As explained in the above, the splitter 18 splits an incident light from an exterior depending on a wavelength of the light to let the split light of different colors enter the different color filters 14a, 14b and 14c. Thus, lights having a wavelength capable of passing through the color filters 14a, 14b and 14c may be incident on corresponding color filters 14a, 14b and 14c. Thus, an amount of a light absorbed by the color filters 14a, 14b and 14c may be reduced so that an amount of a light incident on the photo diodes 10a, 10b and 10c is increased. Furthermore, materials or widths of each refractive layer patterns 18a and 18b deposited in a lateral direction may be adjusted or combined according to known principles for splitting light so that the splitter 18 may have desired splitting characteristics.

Figure 3:
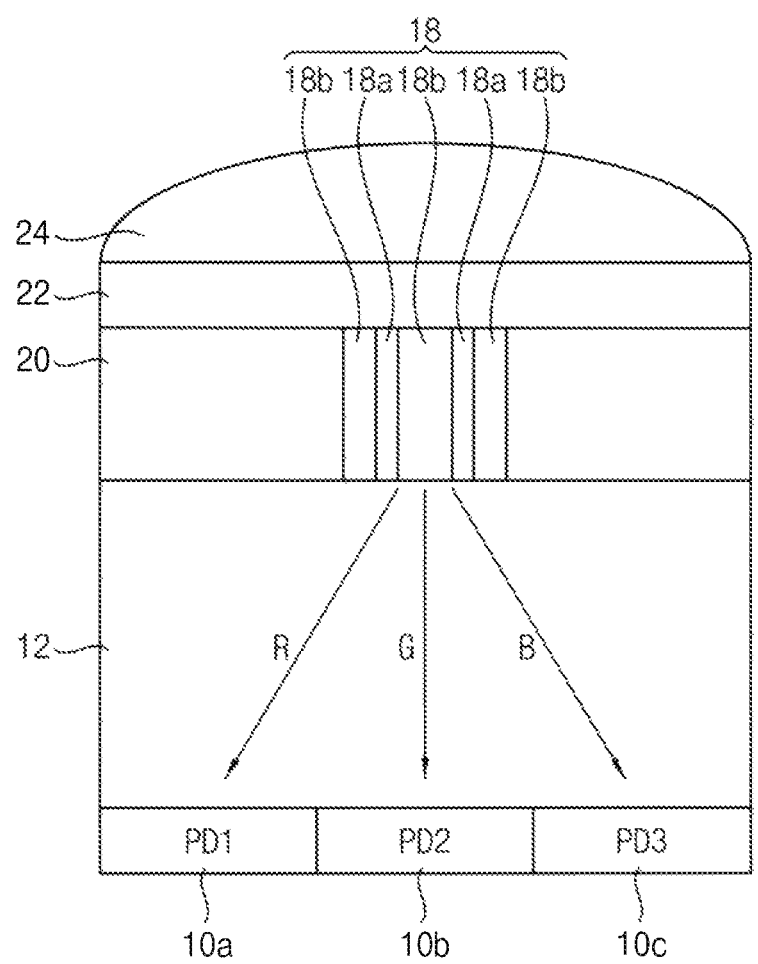
FIG. 3 is a schematic cross-sectional view illustrating an image sensor according to example embodiments.

FIG. 3 is a schematic cross-sectional view illustrating an image sensor according to example embodiments.

The image sensor illustrated in FIG. 3 is substantially the same as the image sensor illustrated in FIG. 1 except for not including a color filter and a planarizing layer in a unit pixel.

Referring to FIG. 3, photo diodes 10a, 10b and 10c may be disposed in a semiconductor substrate. A first interlayer insulation layer 12 may be disposed to cover the photo diodes 10a, 10b and 10c on the semiconductor substrate.

A splitter 18 may be disposed on the first interlayer insulation layer 12.

The splitter 18 splits an incident light from an exterior depending on a wavelength of the light to let the split light of different colors enter the different photo diodes 10a, 10b and 10c, respectively. In an example embodiment, the splitter 18 may function as a color filter. For example, through the splitter 18, a red light may enter the first photo diode 10a, a green light may enter the second photo diode 10b, and a blue light may enter the third photo diode 10c.

The splitter 18 may have a configuration substantially the same as that explained with reference to FIG. 1.

A filling layer pattern 20 may be disposed at both sides of the splitter 18. A capping layer 22 may be disposed on the splitter 18 and the filling layer pattern 20. A micro-lens 24 may be disposed on the capping layer 22. In some embodiments, the micro-lens 24 may be omitted.

As explained in the above, the splitter 18 splits an incident light from an exterior depending on a wavelength of the light so that the split light of different colors may enter the different photo diodes 10a, 10b and 10c without passing through a separate color filter, respectively. Thus, deposition structure of the image sensor may be simplified.

Hereinafter, an example method of forming a splitter included in the image sensor will be described.

FIGS. 4 to 15 are cross-sectional views and plan views for explaining a method of forming a splitter included in an image sensor according to an example embodiment.

Even though not illustrated, a photo diode may be formed in a semiconductor substrate. Color filters may be formed on the photo diode. A lower layer 15 may be formed to cover the color filters. In some embodiments, the color filters may be omitted.

Figure 4:
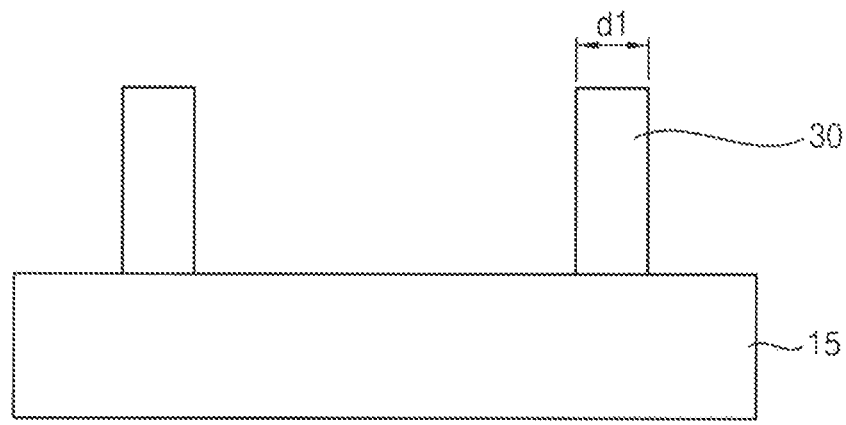
FIGS. 4 to 15 are cross-sectional views and plan views for explaining a method of forming a splitter included in an image sensor according to an example embodiment.
Figure 5:
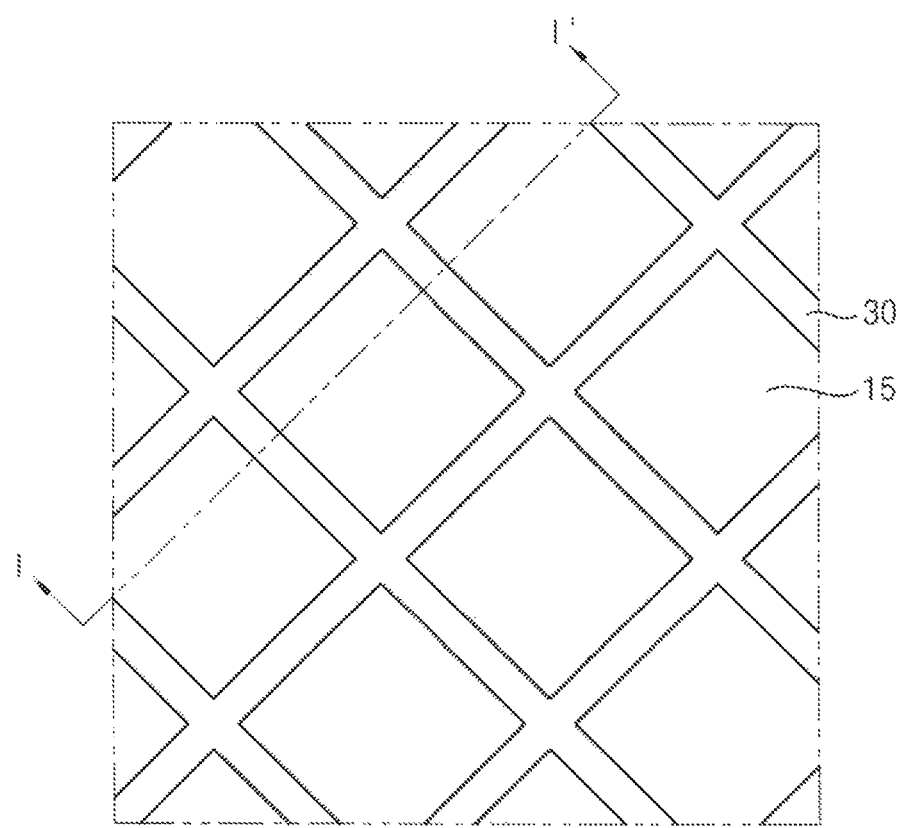

Referring to FIGS. 4 and 5, a mask pattern 30 is formed on the lower layer 15. The lower layer 15 may be a planarizing layer or an interlayer insulation layer. The mask pattern 30 may include a photoresist pattern formed through a photolithography process.

The mask pattern 30 may be formed on a region where a splitter will be formed. In an example embodiment, the mask pattern 30 may have a grid shape in a plan view. For example, the mask pattern 30 may have a shape extending to cross a first color filter, such as a green color filter, disposed under the mask pattern 30 in a diagonal direction.

The mask pattern 30 may have a first line width d1 smaller than a target line width of the splitter to be formed. In an example embodiment, the first line width d1 may be equal to or less than a half of the target line width of the splitter. For example, the first line width d1 may be about ⅓ of the target line width of the splitter. The mask pattern 30 may be formed to have a height larger than a target height of the splitter to be formed.

Figure 6:
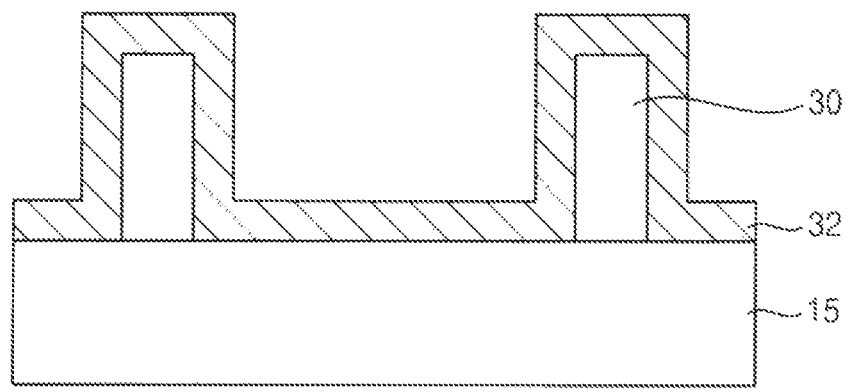

Referring to FIG. 6, a first refractive layer 32 is formed to be conformal on a surface of the mask pattern 30 and a surface of the lower layer 15. The first refractive layer 32 may be formed, for example, through atomic layer deposition (ALD). The first refractive layer 32 may be formed to have a first thickness d2.

The first refractive layer 32 may include a transparent material having a refractive index, for example, in a range of 2.0 to 3.0. Examples of the transparent material may include a metal oxide such as titanium oxide, niobium oxide or the like.

Figure 7:
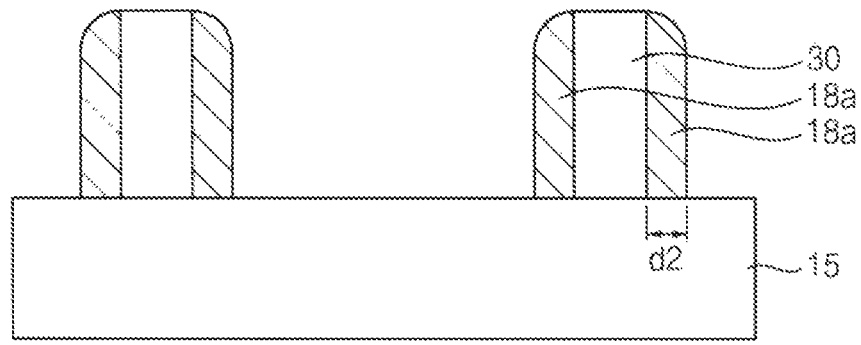
Figure 8:
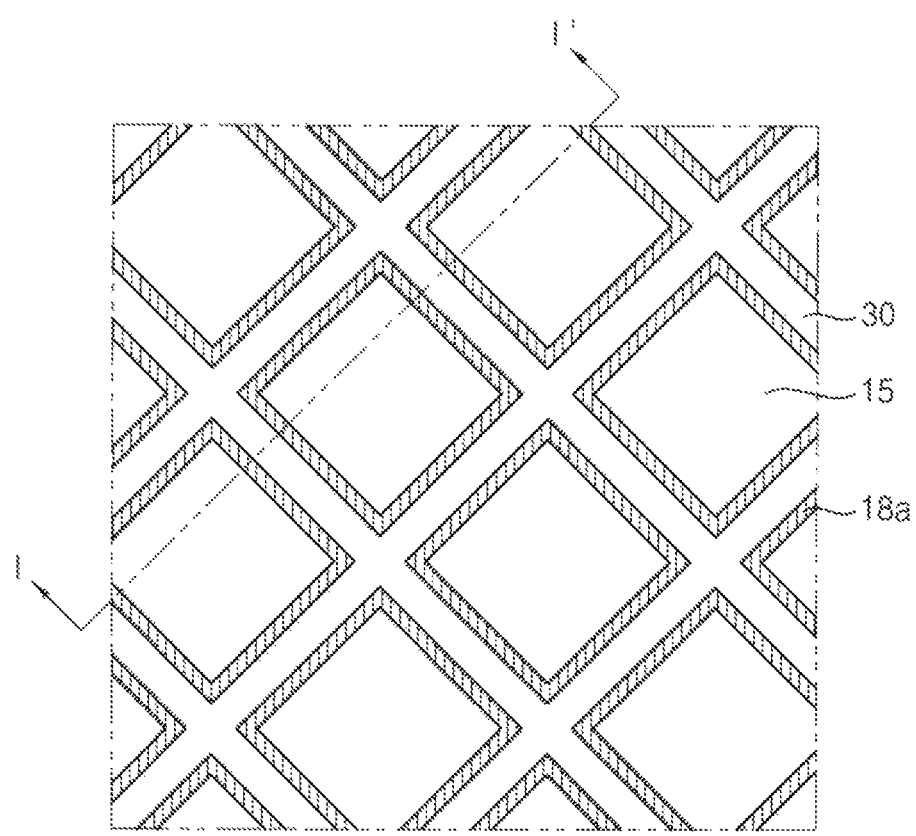

Referring to FIGS. 7 and 8, the first refractive layer 32 is anisotropically-etched to form a first refractive layer pattern 18a on a sidewall of the mask pattern 30. The first refractive layer pattern 18a may have a second line width d2 substantially the same as the first thickness.

In a plan view, the first refractive layer pattern 18a and the mask pattern 30 may have a grid shape.

Figure 9:
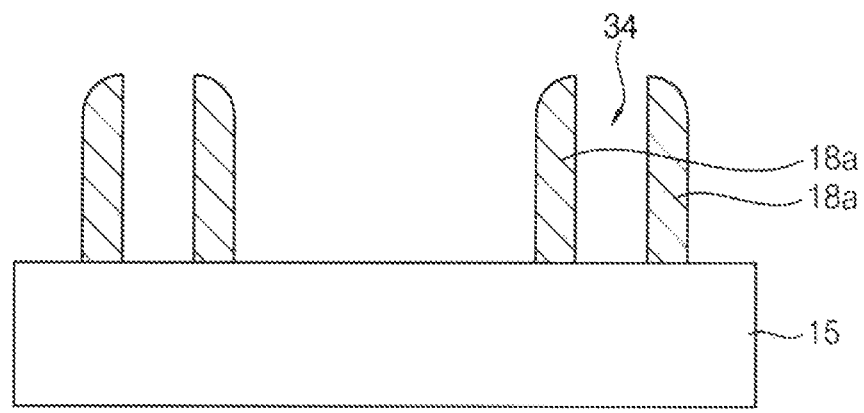
Figure 10:
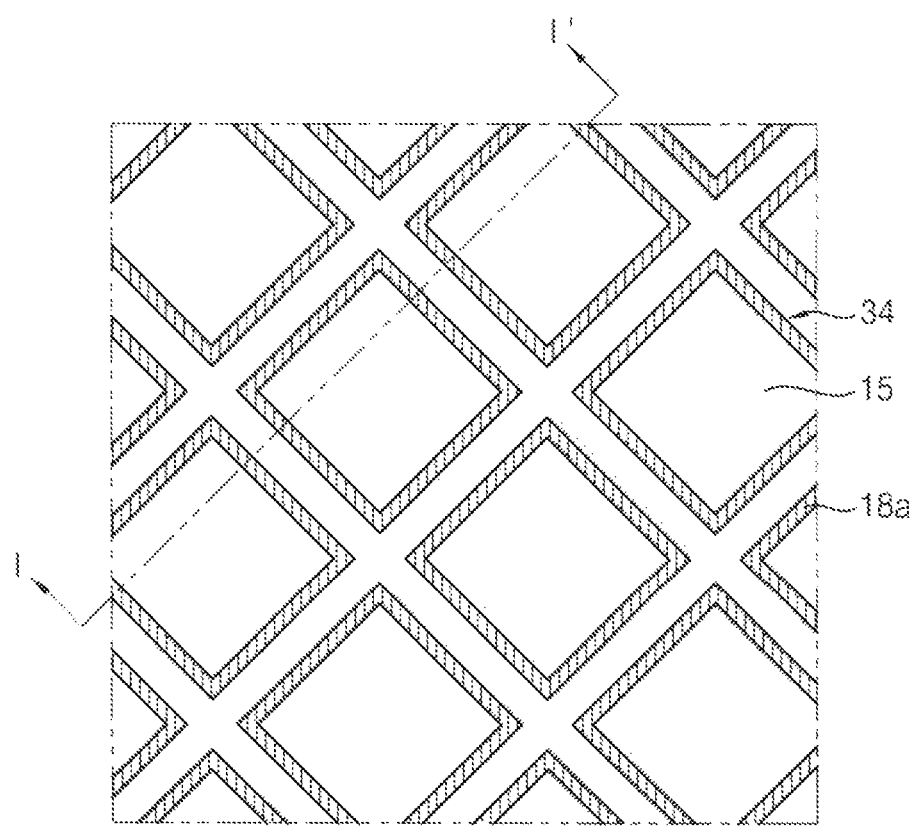

Referring to FIGS. 9 and 10, the mask pattern 30 is removed to form a trench 34. The trench 34 may have a grid shape. A process for removing the mask pattern 30 may include an ashing strip process. Furthermore, the first refractive layer pattern 18a may be disposed at both sides of the trench 34.

Figure 11:
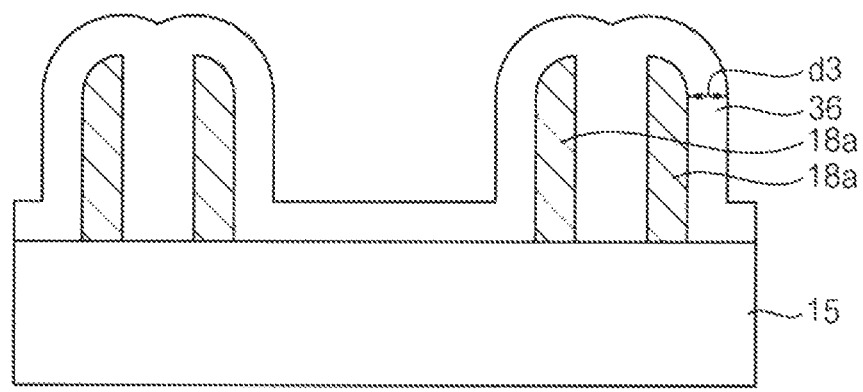

Referring to FIG. 11, a second refractive layer 36 is formed to fill the trench 34 between the first refractive layer patterns 18a and to be conformal on a sidewall of the first refractive layer pattern 18a and the surface of the lower layer 15. The second refractive layer 36 may be formed, for example, through atomic layer deposition (ALD). The second refractive layer 36 may be formed to have a second thickness d3, for example on an outside sidewall of each first refractive layer in a horizontal direction.

The second refractive layer 36 may include a transparent material having a refractive index, for example, in a range of 2.0 to 3.0. Examples of the transparent material may include a metal oxide such as titanium oxide, niobium oxide or the like. The second refractive layer 36 may include a same material as or a different material from the first refractive layer pattern 18a. In certain embodiments, the second thickness d3 may be the same as, or greater than the first thickness d2.

Figure 12:
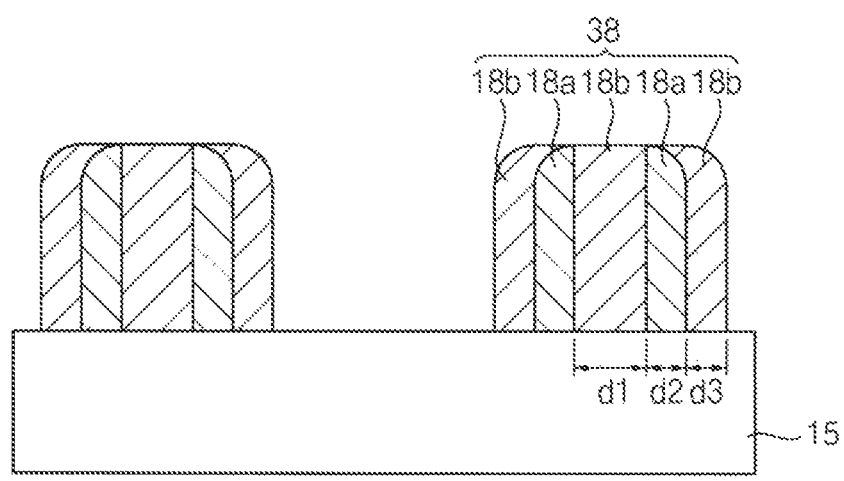

Referring to FIG. 12, the second refractive layer 36 is anisotropically-etched to form a second refractive layer pattern 18b in the trench 34 and on the sidewall of the first refractive layer pattern 18a. As a result, a preliminary pattern structure 38, in which the second refractive layer pattern 18b and the first refractive layer pattern 18a are alternately deposited in a lateral direction, may be formed. A boundary between the second refractive layer pattern 18b and the first refractive layer pattern 18a may extend in a vertical direction.

The second refractive layer pattern 18b in the trench 34 may have the first line width d1. The second refractive layer pattern 18b disposed at an outermost side in the preliminary pattern structure 38 may have a third line width d3 substantially the same as the second thickness.

The preliminary pattern structure 38 may be provided as a preliminary splitter. A height of the preliminary pattern structure 38 may be determined by a height of the mask pattern 30 that is previously formed. The height of the preliminary pattern structure 38 may be substantially the same as or less than the height of the mask pattern 30. In an example embodiment, a line width of the preliminary pattern structure 38 is a summation of the first line width d1, double of the second line width d2 and double of the third line width d3. The line width of the preliminary pattern structure 38 may be substantially the same as the target line width of the splitter. The first to third line widths d1, d2 and d3 may be adjusted depending on the target line width of the splitter.

In certain embodiments, the first line width d1 is greater than each of the second line width d2 and the third line width d3, and may be about ⅓ of the line with of the preliminary pattern structure. In one embodiment, each of the second line width d2 and first line width d1 may be about ⅙ of the line width of the preliminary pattern structure.

In some embodiments, deposition of an additional refractive layer and anisotropic etching process may be further performed on the preliminary pattern structure 38 to further form a refractive layer pattern on a sidewall of the preliminary pattern structure 38.

In an example embodiment, the preliminary pattern structure 38 may have a height between 4,000 Å and 8,000 Å. In an example embodiment, the preliminary pattern structure 38 may have a width between 2,000 Å and 4,000 Å.

Figure 14:
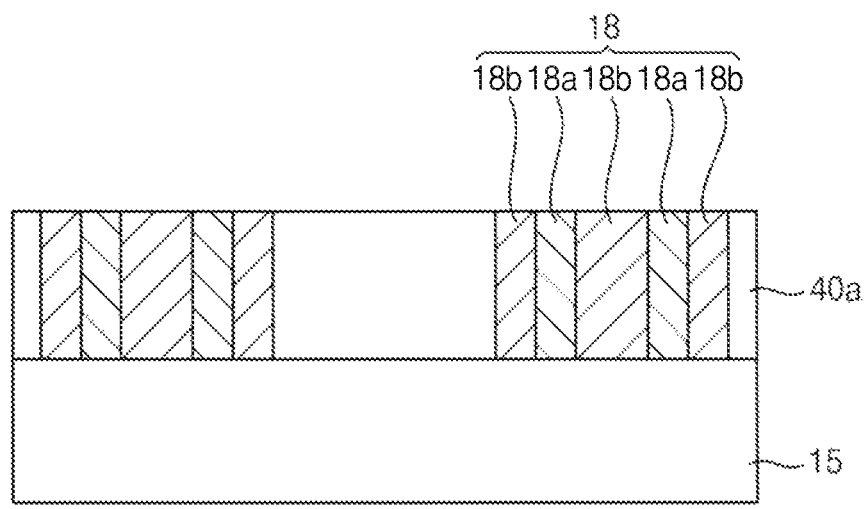

When the preliminary pattern structure 38 is formed through the above processes, a deposition thickness (in a horizontal direction) of the refractive layers may be less than 4,000 Å to 8,000 Å, and may be less than the target height of the preliminary pattern structure 38 (the target height being the eventual height of the actual pattern structure 38 after planarizing as described in FIG. 14). For example, in order to form the preliminary pattern structure 38, summation of deposition thickness of the combined first and second refractive layers 32 and 36 (e.g., in a horizontal direction) may be about ½ to about ⅓ of the target height of the preliminary pattern structure 38. Each refractive pattern 18b or 18a, for example, at mid-height of the preliminary pattern structure 38, may have a thickness that is less than ⅙ of the target height of the preliminary pattern structure 38. In some embodiments, the thickness of each of the conformally formed refractive layers 32 and 36, as measured perpendicularly from the surface on which they are formed, is between about 1/12 to about 1/18 the target height of the preliminary pattern structure 38. Thus, since the thickness of the first and second refractive layers 32 and 36 used for forming the preliminary pattern structure 38 is reduced, a time for forming the preliminary pattern structure 38 may be reduced. Furthermore, defects, which may be caused in the process of forming the preliminary pattern structure 38 for a long time, may be reduced.

Figure 13:
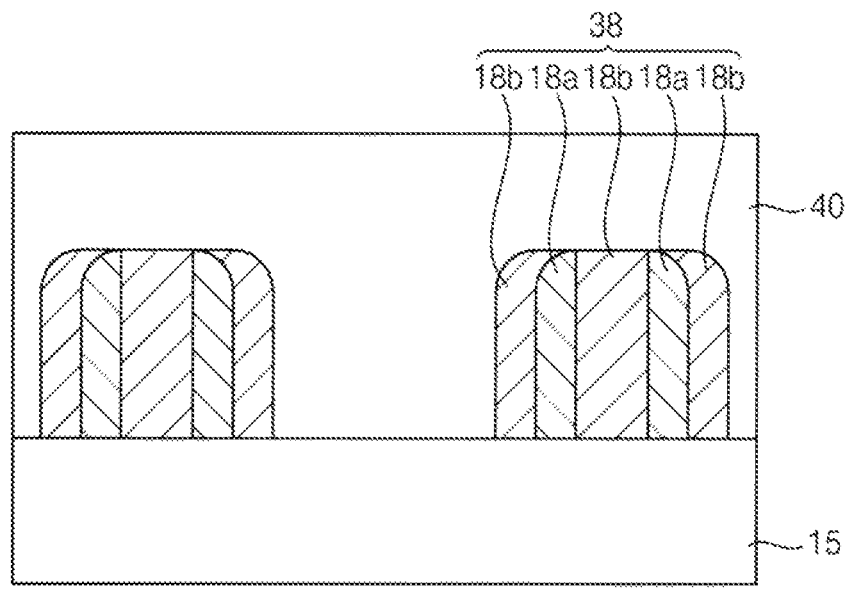

Referring to FIG. 13, a filling layer 40 may be formed to cover the preliminary pattern structure 38. The filling layer 40 may include, for example, silicon oxide. For example, the filling layer 40 may include an SOG layer.

Figure 15:
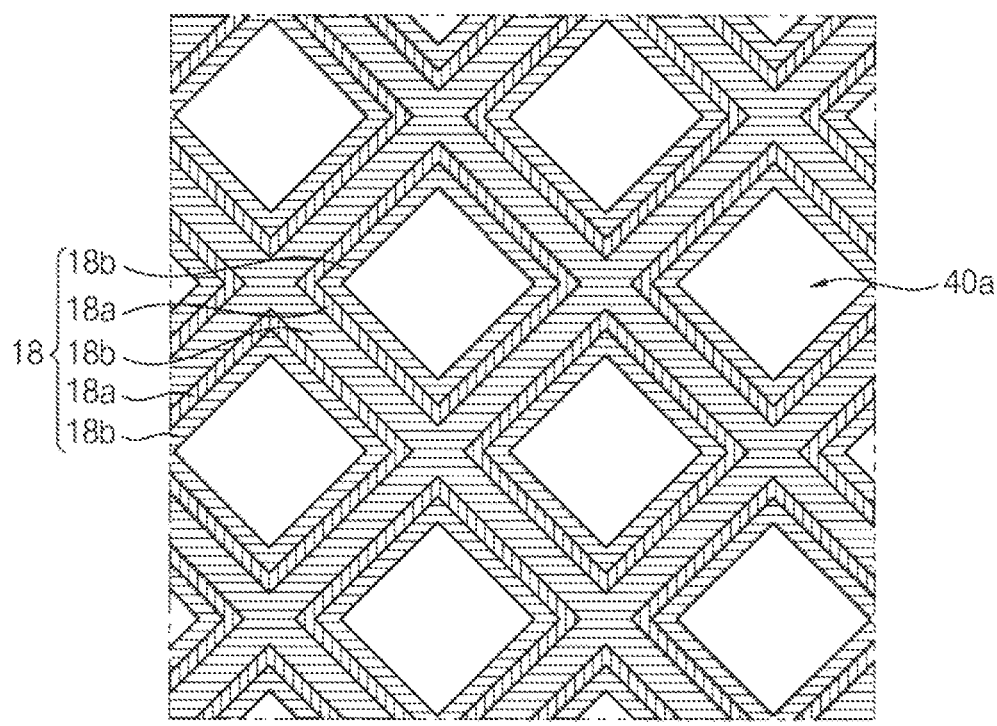

Referring to FIGS. 14 and 15, upper surfaces of the preliminary pattern structure 38 and the filling layer 40 are planarized so that the upper surface of the preliminary pattern structure 38 may be flat. Thus, a pattern structure 18 and a filling layer pattern 40a are formed. The pattern structure 18 may be provided as a splitter. The planarizing process may include, for example, a chemical mechanical polishing process or an etch-back process. When the planarizing process is performed, an upper portion of the preliminary pattern structure 38 may be partially removed. Thus, the height of the pattern structure 18 may be reduced as compared to the height of the preliminary pattern structure 38, with a result that the horizontal width of the pattern structure 18, also described as a refractive pattern structure, is between about ½ and about ⅓ of the height of the pattern structure 18. The pattern structure 18 may be provided as a splitter included in a pixel of an image sensor.

The pattern structure 18 may include a plurality of refractive layer patterns deposited in a lateral direction to be symmetrically disposed at both sides of the central-disposed refractive layer pattern 18b. Each individual refractive layer pattern disposed on one side of the central-disposed refractive layer pattern 18b may have a height to width ratio, for example, of between 18:1 and 12:1. It should be noted that FIGS. 1-16 are not drawn to scale with respect to width to height ratios of the pattern structure 18 and refractive patterns 18a and 18b, but rather certain dimensions of the figures are exaggerated for clarity.

The splitter 18 formed through the above processes may have desired splitting characteristics by adjusting materials or widths of the refractive layer patterns that are deposited in a lateral direction.

Hereinafter, example embodiments of splitters having different structures from the previously explained pattern structure and method for forming the splitters will be described.

Figure 16:
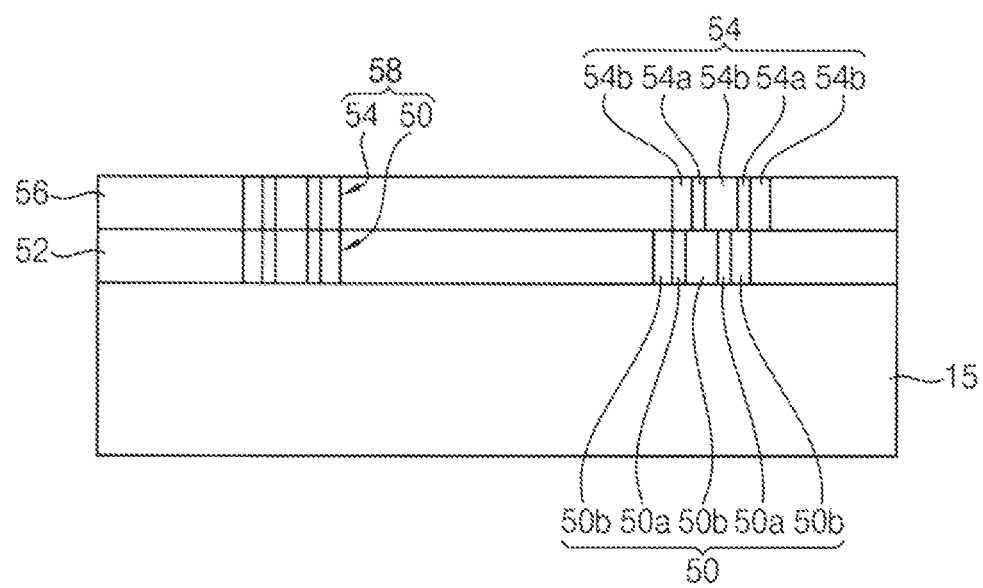
FIG. 16 is a cross-sectional view illustrating a splitter included in an image sensor according to an example embodiment.

FIG. 16 is a cross-sectional view illustrating a splitter included in an image sensor according to an example embodiment.

Referring to FIG. 16, a splitter 58 may have a structure in which a first pattern structure 50 and a second pattern structure 54 are deposited.

In an example embodiment, the pattern structures 50 and 54 respectively having a height of 2,000 Å to 4,000 Å may be deposited to form the splitter 58 having a height of 4,000 Å to 8,000 Å.

The first pattern structure 50 may have a shape in which a plurality of refractive layer patterns 50a and 50b are deposited in a lateral direction. Thus, the refractive layer patterns 50a and 50b may form boundaries extending in a vertical direction.

For example, the first pattern structure 50 may have a structure in which a first refractive layer pattern 50a and a second refractive layer pattern 50b are alternately deposited in a lateral direction. The first pattern structure 50 may have substantially the same structure as the pattern structure previously explained with reference to FIG. 1.

A first filling layer pattern 52 may be disposed at both sides of the first pattern structure 50. The first filling layer pattern 52 may include, for example, silicon oxide. An upper surface of the first pattern structure 50 and an upper surface of the first filling layer pattern 52 may be disposed on the same plane to be continuously connected to each other.

The second pattern structure 54 may be disposed on the first pattern structure 50. In an example embodiment, the second pattern structure 54 may have substantially the same structure as the first pattern structure 50. For example, a width and a material of each refractive layer patterns 54a and 54b included in the second pattern structure 54 may be substantially the same as the width and the material of each refractive layer patterns 50a and 50b included in the first pattern structure 50.

In some embodiments, the width and/or the material of each refractive layer patterns 54a and 54b included in the second pattern structure 54 may be different from the width and/or the material of each refractive layer patterns 50a and 50b included in the first pattern structure 50.

In an example embodiment, the height of the second pattern structure 54 may be substantially same as or different from the height of the first pattern structure 50.

An incident angle and an amount of a light entering each pixels may be different depending on position of pixels in an image sensor mounted on a chip. Thus, position of the second pattern structure 54 disposed on the first pattern structure 50 may be adjusted depending on position of the pixels so that the light entering the pixels may be split to reach correct position. Thus, depending on positions of the pixels, the second pattern structure 54 may be correctly aligned with an upper surface of the first pattern structure 50 so that a side boundary of the second pattern structure 54 may coincide with a side boundary of the first pattern structure 50, or may be shifted from the upper surface of the first pattern structure 50.

In an example embodiment, the first and second pattern structures 50 and 54 may be correctly aligned with each other on pixels disposed in a central portion of the image sensor so that the lower surface of second pattern structure 54 may coincide with the upper surface of the first pattern structure 50. Furthermore, the first and second pattern structures 50 and 54 may be deposited to be shifted from each other so that the lower surface of second pattern structure 54 may partially overlap the upper surface of the first pattern structure 50 and may partly overhang the upper surface of the first pattern structure 50.

A second filling layer pattern 56 may be disposed at both sides of the second pattern structure 54. The second filling layer pattern 56 may include silicon oxide. An upper surface of the second pattern structure 54 and an upper surface of the second filling layer pattern 56 may be disposed on the same plane to be continuously connected to each other.

In order to form the splitter 58, the first pattern structure 50 and the first filling layer pattern 52 may be formed by performing processes substantially same as those previously explained with reference to FIGS. 4 to 15. Thereafter, the second pattern structure 54 and the second filling layer pattern 56 may be formed on the first pattern structure 50 and the first filling layer pattern 52 by further performing processes substantially same as those previously explained with reference to FIGS. 4 to 15. The thicknesses of the first and second pattern structures 50 and 54 may be adjusted such that summation of the thicknesses of the first and second pattern structures 50 and 54 may be substantially same as the desired thickness of the splitter 58.

Figure 17:
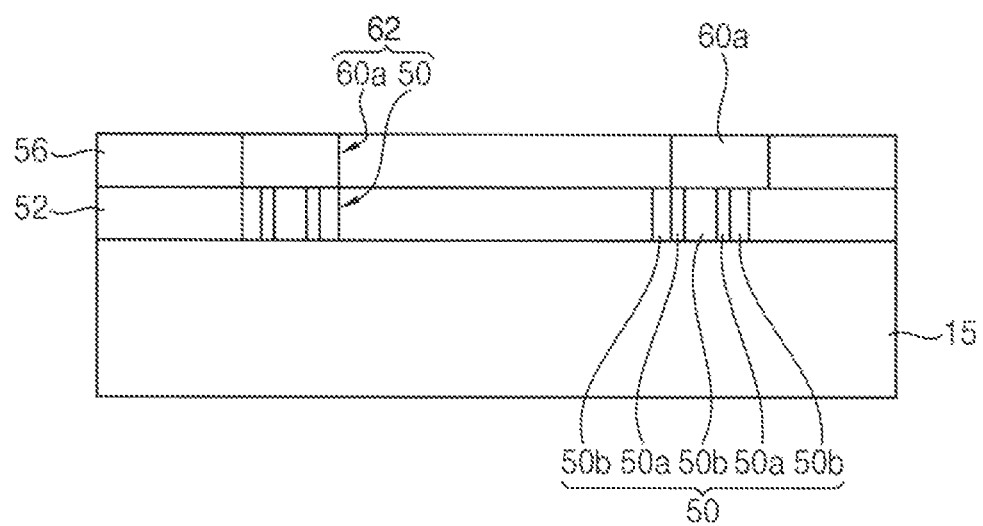
FIG. 17 is a cross-sectional view illustrating a splitter included in an image sensor according to an example embodiment.

FIG. 17 is a cross-sectional view illustrating a splitter included in an image sensor according to an example embodiment.

Referring to FIG. 17, a splitter 60 may have a structure in which a first pattern structure 50 and a second pattern structure 60a are deposited.

A first filling layer pattern 52 may be disposed at both sides of the first pattern structure 50. The first pattern structure 50 and the first filling layer pattern 52 may have substantially the same structures as the first pattern structure 50 and the first filling layer pattern 52 previously explained with reference to FIG. 16.

The second pattern structure 60a may be disposed on the first pattern structure 50. In an example embodiment, the second pattern structure 60a may include a single refractive layer pattern. Thus, the refractive layer pattern may not have a grain boundary extending in a vertical direction.

The refractive layer pattern may include a transparent material having a refractive index in a range of 2.0 to 3.0. Examples of the transparent material may include a metal oxide such as titanium oxide, niobium oxide or the like. The refractive layer pattern may include the same material as or a different material from at least a portion of a material included in the first pattern structure 50.

In an example embodiment, a height of the second pattern structure 60a may be the same as or different from a height of the first pattern structure 50.

A second filling layer pattern 56 may be disposed at both sides of the second pattern structure 60a. The second filling layer pattern 56 may include, for example, silicon oxide. An upper surface of the second pattern structure 60a and an upper surface of the second filling layer pattern 56 may be disposed on the same plane to be continuously connected to each other.

Depending on the position of pixels in an image sensor, the second pattern structure 60a may be correctly aligned with an upper surface of the first pattern structure 50 or may be shifted from the upper surface of the first pattern structure 50.

Figure 18:
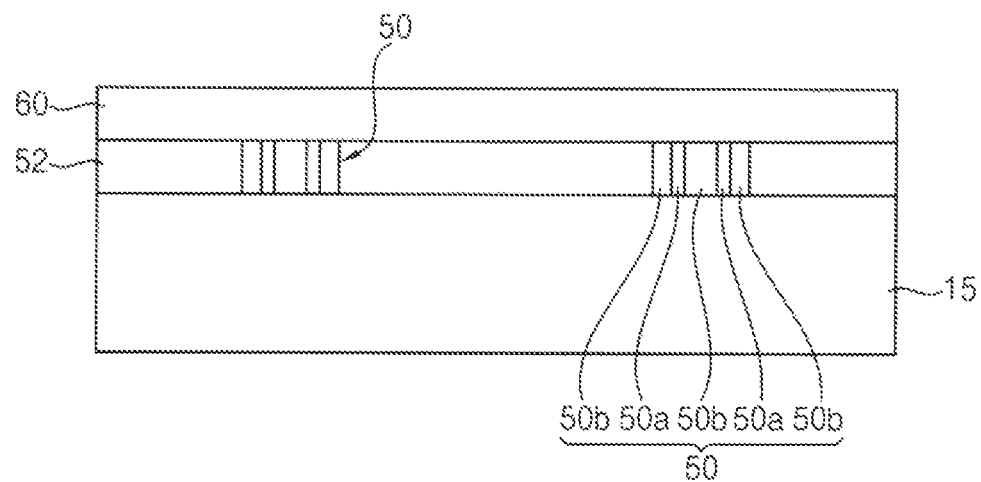
FIGS. 18 and 19 are cross-sectional views illustrating a method for forming a splitter included in an image sensor according to an example embodiment.
Figure 19:
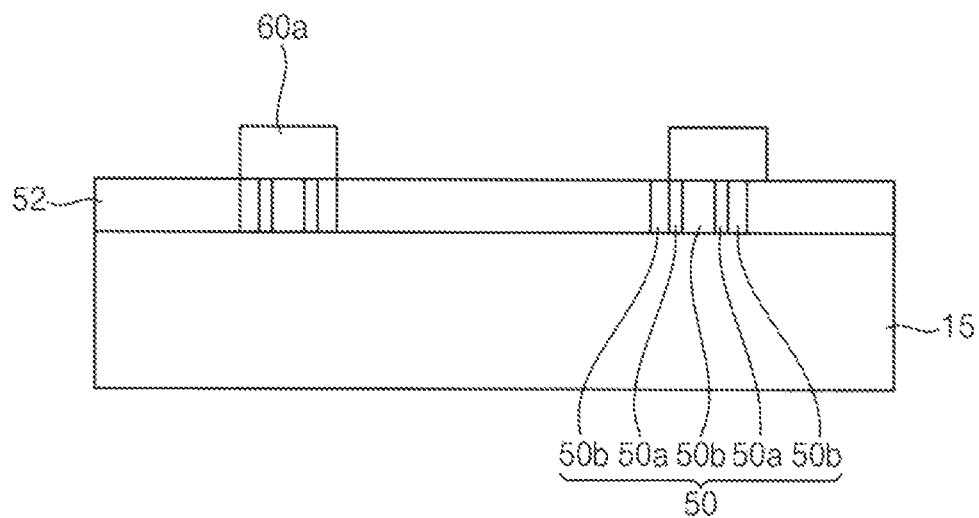

FIGS. 18 and 19 are cross-sectional views illustrating a method for forming a splitter included in an image sensor according to an example embodiment.

A first pattern structure 50 and a first filling layer pattern 52 are formed on a lower layer 15. The first pattern structure 50 and the first filling layer pattern 52 may be formed through processes substantially the same as those previously explained with reference to FIGS. 4 to 15. The first pattern structure 50 may have a predetermined thickness smaller than a target thickness of a splitter.

Referring to FIG. 18, a refractive layer 60 is formed on the first pattern structure 50 and the first filling layer pattern 52. The refractive layer 60 may be formed, for example, through atomic layer deposition (ALD).

Referring to FIG. 19, a mask pattern (not shown) is formed on the refractive layer 60. The mask pattern may include a photoresist pattern formed through a photolithography process. The refractive layer 60 may be etched using the mask pattern as an etching mask to form a second pattern structure 60a.

Referring to FIG. 17, a second filling layer may be formed to cover the second pattern structure 60a. The second filling layer may include, for example, silicon oxide. For example, the second filling layer may include an SOG layer.

Upper surfaces of the second pattern structure 60a and the second filling layer are planarized so that the upper surface of the second pattern structure 60a may be flat. Thus, a second filling layer pattern 56 may be formed at both sides of the second pattern structure 60a. The planarizing process may include a chemical mechanical polishing process or an etch-back process. When the planarizing process is performed, an upper portion of the second pattern structure 60a may be partially removed. Thus, the height of the second pattern structure 60a may be reduced.

Figure 20:
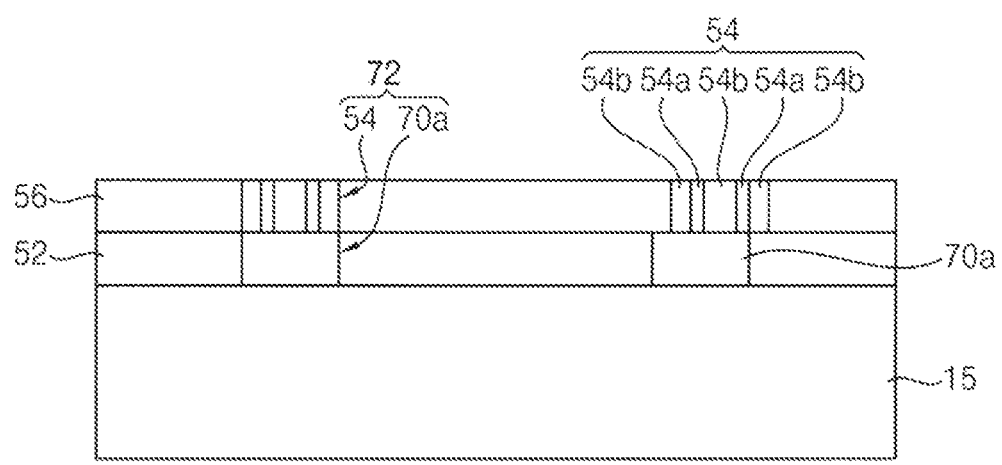
FIG. 20 is a cross-sectional view illustrating a splitter included in an image sensor according to an example embodiment.

FIG. 20 is a cross-sectional view illustrating a splitter included in an image sensor according to an example embodiment.

Referring to FIG. 20, a splitter 72 may have a structure in which a first pattern structure 70a and a second pattern structure 54 are deposited. A first filling layer pattern 52 may be disposed at both sides of the first pattern structure 70a, and a second filling layer pattern 56 may be disposed at both sides of the second pattern structure 54.

The first pattern structure 70a and the first filling layer pattern 52 may have substantially the same structures as the second pattern structure 60a and the second filling layer pattern 56 previously explained with reference to FIG. 17. Thus, the first pattern structure 70a may be formed of a single refractive layer pattern. Thus, the refractive layer pattern may not have a grain boundary extending in a vertical direction.

The second pattern structure 54 may be disposed on the first pattern structure 70a. The second pattern structure 54 and the second filling layer pattern 56 may have substantially the same structures as the first pattern structure 50 and the first filling layer pattern 52 previously explained with reference to FIG. 17. Thus, the second pattern structure 54 may have a shape in which a plurality of refractive layers 54a and 54b are deposited in a lateral direction. Thus, the refractive layer patterns 54a and 54b may form a boundary extending in a vertical direction. Thus, a grain boundary extending in a vertical direction may be formed at an interface between the refractive layer patterns 54a and 54b.

Depending on position of pixels in an image sensor, a lower surface of the second pattern structure 54 may coincide with or may be shifted from an upper surface of the first pattern structure 70a.

In order to form the splitter 72, the first pattern structure 70a and the first filling layer pattern 52 may be formed by performing processes substantially the same as those previously explained with reference to FIGS. 18 and 19. Thereafter, the second pattern structure 54 and the second filling layer pattern 56 may be formed on the first pattern structure 70a and the first filling layer pattern 52 by further performing processes substantially the same as those previously explained with reference to FIGS. 4 to 15.

The above-explained splitters according to example embodiments may be disposed in image sensors having various structures. Thus, structures of the image sensors are not specifically limited. Hereinafter, some embodiments of image sensors including splitters according to example embodiments will be described.

Figure 21:
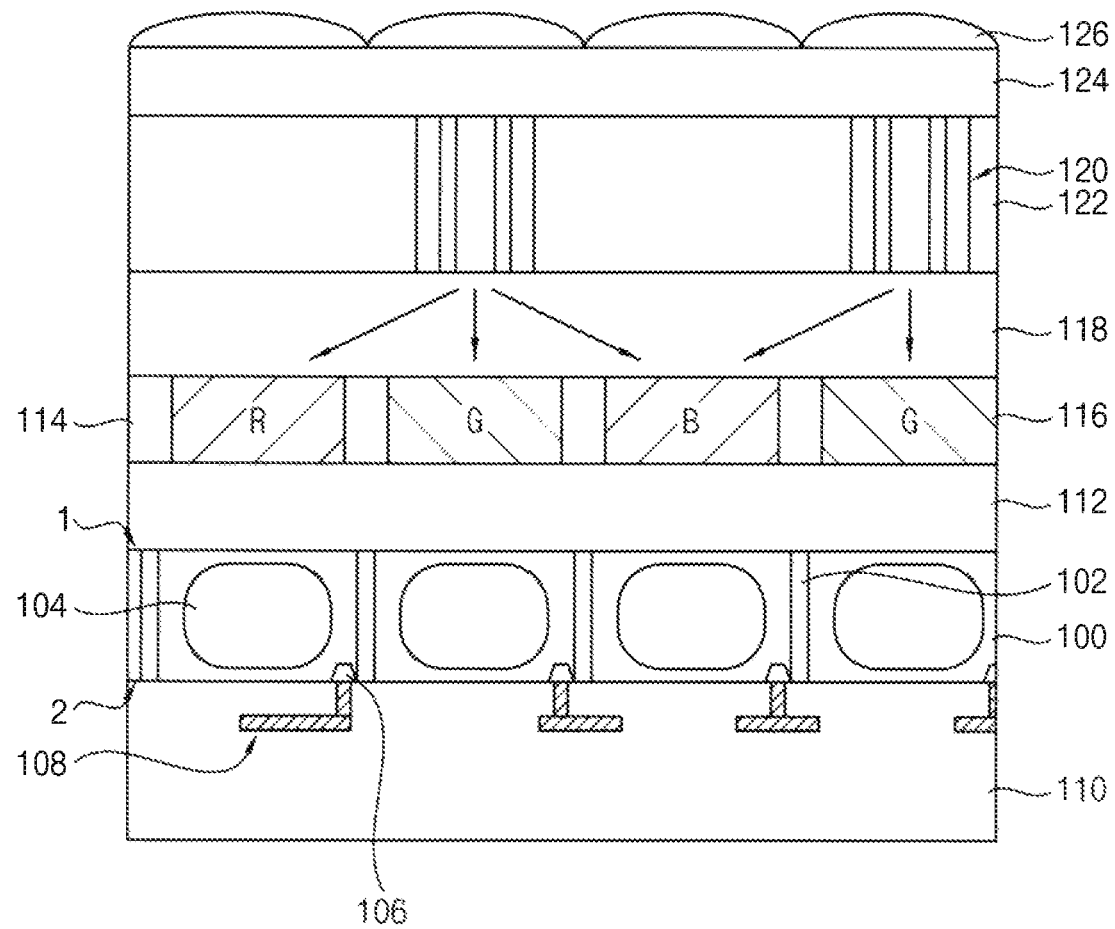
FIG. 21 is a cross-sectional view illustrating an image sensor according to example embodiments.

FIG. 21 is a cross-sectional view illustrating an image sensor according to an example embodiment.

The image sensor illustrated in FIG. 21 may be a back-illuminated CMOS image sensor.

Referring to FIG. 21, the image sensor may include a plurality of unit pixels arranged in a matrix configuration. Each unit pixel may include a photo diode 104 disposed in a semiconductor substrate 100, a color filter 116 on a first surface 1 of the semiconductor substrate 100, and a splitter 120 disposed on the color filter 116. Transistors (not shown) and a wiring structure 108 may be disposed on a second surface 2 of the semiconductor substrate 100.

A deep trench isolation pattern 102 may be disposed in the semiconductor substrate 100 to separate each unit pixel regions. The deep trench isolation pattern 102 may be disposed in a first trench passing through the semiconductor substrate 100 from the second surface 2 to the first surface 1. In an example embodiment, the deep trench isolation pattern 102 may include an insulation spacer (not shown) and a conductive pattern, for example, including polysilicon, disposed on the insulation spacer to fill the first trench. The deep trench isolation pattern 102 may have a shape having an internal width reduced from the second surface 2 toward the first surface 1 in the semiconductor substrate 100.

The photo diode 104 may be disposed in each unit pixel regions. The photo diode 104 may include an impurity region. A floating diffusion region 106 may be disposed in a portion adjacent to the second surface 2 in the semiconductor substrate 100. For example, the floating diffusion region 106 may be doped with n-type impurities.

Even though not illustrated, a transmission transistor, a reset transistor, a selection transistor or the like may be disposed on the second surface 2 of the semiconductor substrate 100.

A first interlayer insulation layer 110 may be disposed on the second surface 2 of the semiconductor substrate 100 to cover the transistors. The wiring structure 108 may be disposed on and in the first interlayer insulation layer 110. The wiring structure 108 may be electrically connected to the transistors and the floating diffusion region 106.

A second interlayer insulation layer 112 may be disposed on the first surface 1 of the semiconductor substrate 100. The color filter 116 may be disposed on the second interlayer insulation layer 112 to face the photo diode 104. For example, the color filter 116 may include a red color filter R, a blue color filter B and a green color filter G. The color filters may be arranged in a matrix configuration.

The red, green and blue color filters R, G and B may be respectively disposed in a hole formed by an insulation fence 114. For example, the insulation fence 114 having a grid shape may be disposed among the red, green and blue color filters R, G and B. The insulation fence 114 may include, for example, silicon oxide. As the insulation fence 114 is provided, cross-talk defects may be reduced and/or prevented.

A planarizing layer 118 may be disposed on the color filters 116 and the insulation fence 114.

A splitter 120 may be disposed on the planarizing layer 118. The splitter 120 may split an incident light so that a red light may enter the red color filter R, a blue light may enter the blue color filter B, and a green light may enter the green color filter G.

In an example embodiment, the splitter 120 may be formed on the color filters 116 with position same as that previously explained with reference to FIG. 2.

In an example embodiment, the splitter 120 may have a deposition structure the same as one of those previously explained with reference to FIGS. 1, 16 and 17. A filling layer pattern 122 may be disposed at both sides of the splitter 120.

A capping layer 124 may be disposed on the splitter 120 and the filling layer pattern 122. The capping layer 124 may include silicon oxide.

A micro-lens may be disposed on the capping layer 124. In some embodiments, the micro-lens 126 may be omitted.

Figure 22:
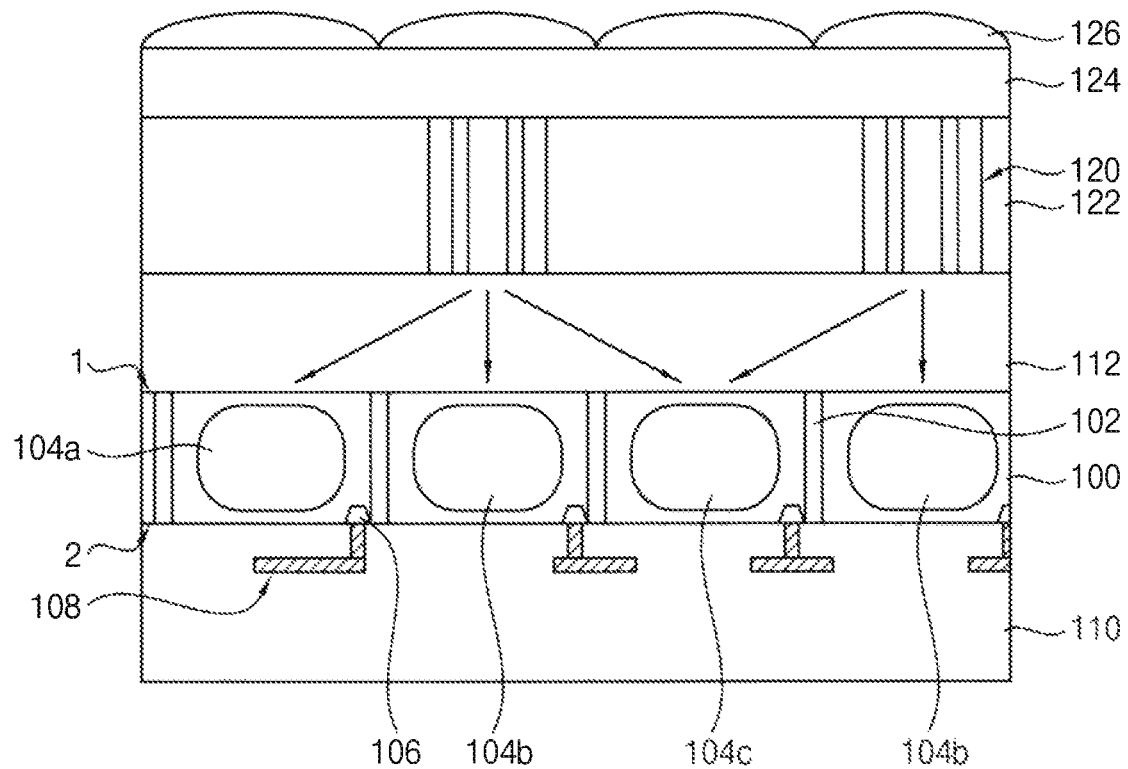
FIG. 22 is a cross-sectional view illustrating an image sensor according to example embodiments.

FIG. 22 is a cross-sectional view illustrating an image sensor according to example embodiments.

The image sensor illustrated in FIG. 22 may have substantially the same configuration as the image sensor illustrated in FIG. 21 except for not including color filters.

Referring to FIG. 22, a splitter 120 may be disposed on a second interlayer insulation layer 112 formed on a first surface of a semiconductor substrate 100.

The splitter 120 may split an incident light so that a red light, a blue light and a green light may enter different photo diodes, respectively. For example, the splitter 120 may split an incident light so that a red light may enter a first photo diode 104a, a green light may enter a second photo diode 104b, and a blue light may enter a third photo diode 104c.

In an example embodiment, the splitter 120 may have a deposition structure the same as one of those previously explained with reference to FIGS. 1, 16 and 17. A filling layer pattern 122 may be disposed at both sides of the splitter 120.

Figure 23:
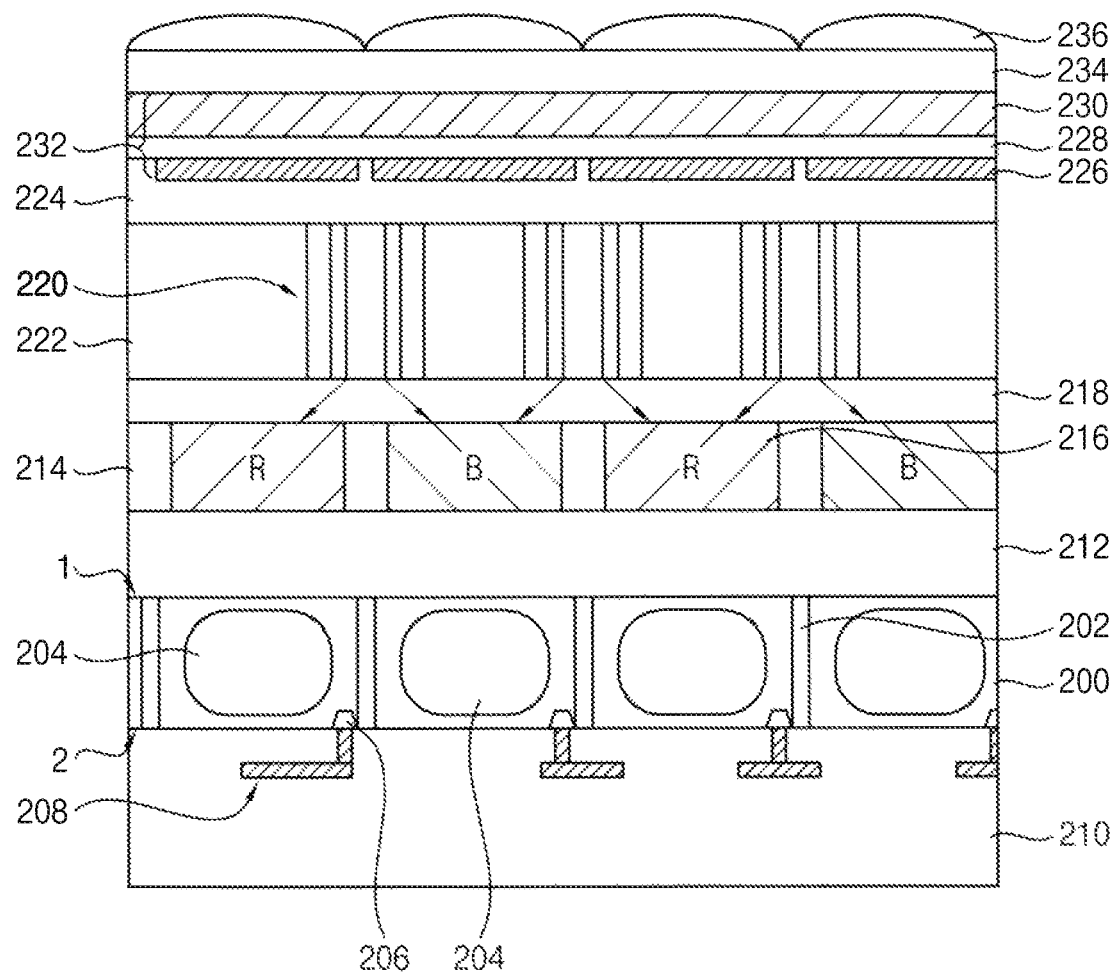
FIG. 23 is a cross-sectional view illustrating an image sensor according to example embodiments.

FIG. 23 is a cross-sectional view illustrating an image sensor according to example embodiments.

The image sensor illustrated in FIG. 23 may include an organic photo diode.

Referring to FIG. 23, the image sensor may include a plurality of unit pixels arranged in a matrix configuration. The unit pixel may include an organic photo diode 232, a color filter 216, a splitter 220 and a lower photo diode 204. A transistor and a wiring structure 208 may be disposed on a second surface 2 of a semiconductor substrate 200.

A deep trench isolation pattern 202 may be disposed in the semiconductor substrate 200 to separate each unit pixel region. The deep trench isolation pattern 202 may be disposed in a first trench passing through the semiconductor substrate 200 from the second surface 2 to the first surface 1.

The lower photo diode 204 may be disposed in each unit pixel regions. The lower photo diode 204 may be disposed in the semiconductor substrate 200. The lower photo diode 204 may include an impurity region. A floating diffusion region 206 may be disposed in a portion adjacent to the second surface 2 in the semiconductor substrate 200. For example, the floating diffusion region 206 may be doped with n-type impurities.

A transmission transistor, a reset transistor, a selection transistor or the like may be disposed on the second surface 2 of the semiconductor substrate 200.

A first interlayer insulation layer 210 may be disposed on the second surface 2 of the semiconductor substrate 200 to cover the transistors. The wiring structure 208 may be disposed on and in the first interlayer insulation layer 210. The wiring structure 208 may be electrically connected to the transistors and the floating diffusion region 206.

A second interlayer insulation layer 212 may be disposed on the first surface 1 of the semiconductor substrate 200. The color filter 216 may be disposed on the second interlayer insulation layer 212. For example, the color filter 216 may include a red color filter R and a blue color filter B. The color filters 216 may be arranged in a matrix configuration. The red and blue color filters R and B may be respectively disposed in a hole formed by an insulation fence 214.

A planarizing layer 218 may be disposed to cover the color filters 216. A splitter 220 may be disposed on the planarizing layer 218. The splitter 220 may split an incident light so that a red light may enter the red color filter R, and a blue light may enter the blue color filter B.

In an example embodiment, the splitter 220 may have a deposition structure the same as one of those previously explained with reference to FIGS. 1, 16, 17 and 20. A filling layer pattern 222 may be disposed at both sides of the splitter 220.

A third interlayer insulation layer 224 may be disposed on the splitter 220 and the filling layer pattern 222. The third interlayer insulation layer 224 may include, for example, silicon oxide.

The organic photo diode 232 may be disposed on the third interlayer insulation layer 224.

The organic photo diode 232 may have a structure including a lower transparent electrode 226, an organic layer 228 and an upper transparent electrode layer 230. The lower transparent electrode 226 may be disposed to be spaced apart from and to face corresponding color filter 216. In an example embodiment, one color filter 216 and one lower transparent electrode 226 may be disposed to face each other in each unit pixel region.

The organic photo diodes 232 may be separated from each other by the lower transparent electrode 226. Even though not illustrated, the lower transparent electrode 226 may be electrically connected to the second surface of the semiconductor substrate 200 through a silicon via contact and via contacts. Thus, the lower transparent electrode 226 may be electrically connected to the wiring structure 208.

The lower transparent electrode 226 may be disposed in an opening formed at the third interlayer insulation layer 224. Furthermore, upper surfaces of the lower transparent electrode 226 and the third interlayer insulation layer 224 may be coplanar.

The organic layer 228 and the upper transparent electrode layer 230 may be commonly shared for adjacent organic photo diodes 232.

For example, the lower transparent electrode 226 and the upper transparent electrode layer 230 may include ITO, IZO, ZnO, SnO2, ATO (antimony-doped tin oxide), AZO (Al-doped zinc oxide), GZO (gallium-doped zinc oxide), TiO2, FTO (fluorine-doped tin oxide or the like.

The organic layer 228 may be disposed on the lower transparent electrodes 226 and the third interlayer insulation layer 224. The organic layer 228 may include an organic material that causes photoelectric conversion in response to a light having a specific wavelength. For example, the organic layer 228 may cause photoelectric conversion in response to a green light. Thus, the organic layer 228 may function as a green color filter as well as a photo diode.

The organic layer 228 may be implemented by combination of an electron-donating organic material and an electron-accepting organic material. For example, the organic layer 228 may have a single-layered structure or a multiple-layered structure, in which a p-type semiconductor material and an n-type semiconductor material form pn flat junction or bulk heterojunction.

A capping layer 234 may be disposed on the upper transparent electrode layer 230. The capping layer 234 may include silicon oxide.

A micro-lens 236 may be disposed on the capping layer 234. In some embodiments, the micro-lens 236 may be omitted.

In the image sensor including the organic photo diode, a green light entering the organic layer 228 may cause photoelectric conversion to generate a photo electron. Furthermore, a red light and a blue light may be split by the splitter 220 disposed under the organic layer 228 to respectively enter a red color filter and a blue color filter. Thus, an amount of light absorbed by the red color filter and the blue color filter may be reduced. Therefore, the image sensor may have a high sensitivity.

Figure 24:
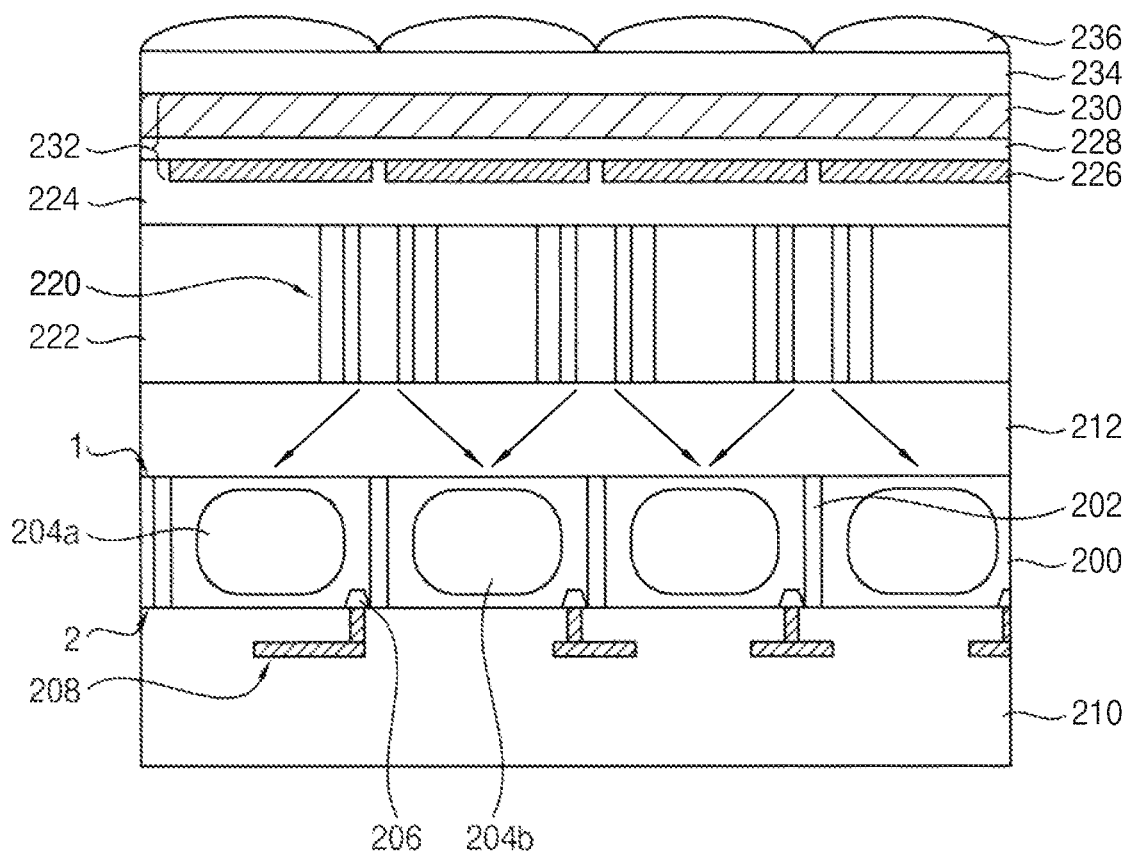
FIG. 24 is a cross-sectional view illustrating an image sensor according to example embodiments.

FIG. 24 is a cross-sectional view illustrating an image sensor according to example embodiments.

The image sensor illustrated in FIG. 24 may have substantially the same configuration as the image sensor illustrated in FIG. 23 except for not including color filters.

Referring to FIG. 24, a splitter 220 may be disposed on a second interlayer insulation layer 212.

The splitter 220 may split an incident light so that a red light and a blue light may enter a first lower photo diode 204a and a second lower photo diode 204b, respectively. For example, the splitter 220 may split an incident light so that the red light may enter the first lower photo diode 204a, and the blue light may enter the second lower photo diode 204b. A green light may be photoelectric-converted by an organic photo diode 232.

In an example embodiment, the splitter 220 may have a deposition structure the same as one of those previously explained with reference to FIGS. 1, 16 and 17. A filling layer pattern 222 may be disposed at both sides of the splitter 220.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor comprising:
   a plurality of photo diodes disposed at a semiconductor substrate; and
   a splitter disposed on the photo diodes and splitting an incident light depending on a wavelength so that split light of different colors enters different photo diodes, respectively,
   wherein the splitter includes a first pattern structure having a cross-sectional structure in which a plurality of refractive layer patterns are disposed adjacent to each other in a lateral direction, and
   wherein a grain boundary is formed at an interface between the refractive layer patterns adjacent to each other in the first pattern structure.

2. The image sensor of claim 1, wherein the width in a horizontal direction of the combined plurality of refractive layer patterns is less than the height in a vertical direction of the combined plurality of refractive layer patterns.

3. The image sensor of claim 2, wherein:
   the width of the combined plurality of refractive layer patterns is less than ½ the height of the combined plurality of refractive layer patterns.

4. The image sensor of claim 1, wherein the refractive layer patterns of the first pattern structure include a transparent material having a refractive index in a range of 2.0 to 3.0.

5. The image sensor of claim 4, wherein the refractive layer patterns include titanium oxide or niobium oxide.

6. The image sensor of claim 1, wherein the refractive layer patterns adjacent to each other in the first pattern structure include the same transparent material or include different transparent materials.

7. The image sensor of claim 1, wherein the refractive layer patterns are symmetrically arranged in relation to each other with respect to a refractive layer pattern disposed in a central portion of the first pattern structure.

8. The image sensor of claim 1, wherein the splitter further includes a second pattern structure disposed on an upper surface or a lower surface of the first pattern structure.

9. The image sensor of claim 8, wherein the second pattern structure is aligned with an upper surface of the first pattern structure or is shifted from the upper surface of the first pattern structure.

10. The image sensor of claim 1, wherein the splitter has a grid shape in a plan view.

11. The image sensor of claim 1, wherein color filters are disposed between the photo diodes and the splitter, and the color filters are disposed to be spaced apart from and to face corresponding photo diodes, respectively.

12. The image sensor of claim 11, wherein the color filters include a red color filter, a green color filter and a blue color filter, which are disposed to form an array, wherein the splitter splits an incident light so that a red light enters the red color filter, a green light enters the green color filter, and a blue light enters the blue color filter.

13. The image sensor of claim 12, wherein the splitter is spaced apart from the color filters, and is disposed to cross the green color filter in a diagonal direction on the green color filter.

14. The image sensor of claim 1, further comprising a filling layer pattern disposed at both sides of the splitter, wherein an upper surface of the splitter and an upper surface of the filling layer pattern are disposed on the same plane.

15. The image sensor of claim 1, further comprising an organic photo diode disposed on the splitter.

16. The image sensor of claim 1, further comprising a micro-lens disposed on the splitter.

17. An image sensor comprising:
- a plurality of photo diodes respectively disposed in unit pixel regions of a semiconductor substrate; and
- a splitter disposed on a first surface of the semiconductor substrate and spaced apart from the photo diodes, the splitter splitting an incident light depending on a wavelength so that split light of different colors enters different photo diodes, respectively;
- an isolation pattern disposed in the semiconductor substrate to separate the unit pixel regions; and
- a wiring structure disposed on a second surface of the semiconductor substrate,
- wherein the splitter includes a first pattern structure in which a boundary extending in a vertical direction is formed between two of a plurality of refractive layer patterns.

18. An image sensor comprising:
- a plurality of photo diodes respectively disposed in unit pixel regions of a semiconductor substrate;
- a splitter disposed on a first surface of the semiconductor substrate and spaced apart from the photo diodes, the splitter splitting an incident light depending on a wavelength so that split light of different colors enters different photo diodes, respectively; and
- a filling layer pattern disposed at both sides of the splitter,
- wherein the splitter consists of a first refractive pattern structure having a cross-sectional structure in which a plurality of refractive layer patterns are stacked in a lateral direction with respect to each other, and
- wherein each of the plurality of refractive layer patterns of the first refractive pattern structure is formed by a material different from a material of the filling layer pattern.

* * * * *